(12) United States Patent
Kim et al.

(10) Patent No.: US 6,188,601 B1
(45) Date of Patent: Feb. 13, 2001

(54) FERROELECTRIC MEMORY DEVICE HAVING SINGLE BIT LINE COUPLED TO AT LEAST ONE MEMORY CELL

(75) Inventors: Duck-Ju Kim; Jae-Whan Kim, both of Ichon (KR)

(73) Assignee: Hyundai Electronics Industries Co., Ltd., Ichon (KR)

( * ) Notice: Under 35 U.S.C. 154(b), the term of this patent shall be extended for 0 days.

(21) Appl. No.: 09/570,580

(22) Filed: May 12, 2000

(30) Foreign Application Priority Data

May 13, 1999 (KR) ................................................ 99-17133

(51) Int. Cl.[7] ................................. G11C 11/22; G11C 7/00
(52) U.S. Cl. ............................................. 365/145; 365/203
(58) Field of Search ..................................... 365/145, 149, 365/203

(56) References Cited

U.S. PATENT DOCUMENTS 6,028,783 * 2/2000 Allen et al. ........................... 365/145

* cited by examiner

Primary Examiner—Trong Phan
(74) Attorney, Agent, or Firm—Jacobson, Price, Holman & Stern, PLLC (57) ABSTRACT

A semiconductor memory device, includes: a single bit line; at least one memory cell coupled to said single bit line for storing a first charge corresponding to predetermined data; a reference voltage generation circuit for generating a reference voltage as a first voltage; a charge pump circuit for generating a second charge substantially corresponding to the reference voltage; a transistor for combining the first charge with the second charge at a read operation, thereby generating a second voltage; and a sense amplifier coupled to said single bit line for sensing and amplifying a difference between the first voltage and the second voltage, to thereby read out the predetermined data. The semiconductor memory device can reduce its chip size by employing the single bit line coupled to at least one memory cell and effectively sense and amplify the difference between the first voltage from the reference voltage generation circuit and the second voltage from the single bit line at the read operation.

19 Claims, 9 Drawing Sheets

FERROELECTRIC MEMORY DEVICE HAVING SINGLE BIT LINE COUPLED TO AT LEAST ONE MEMORY CELL

FIELD OF THE INVENTION

The present invention relates to a semiconductor memory device; and, more particularly, to a ferroelectric memory device having a single bit line coupled to at least one memory cell.

DESCRIPTION OF THE PRIOR ART

Figure 1:
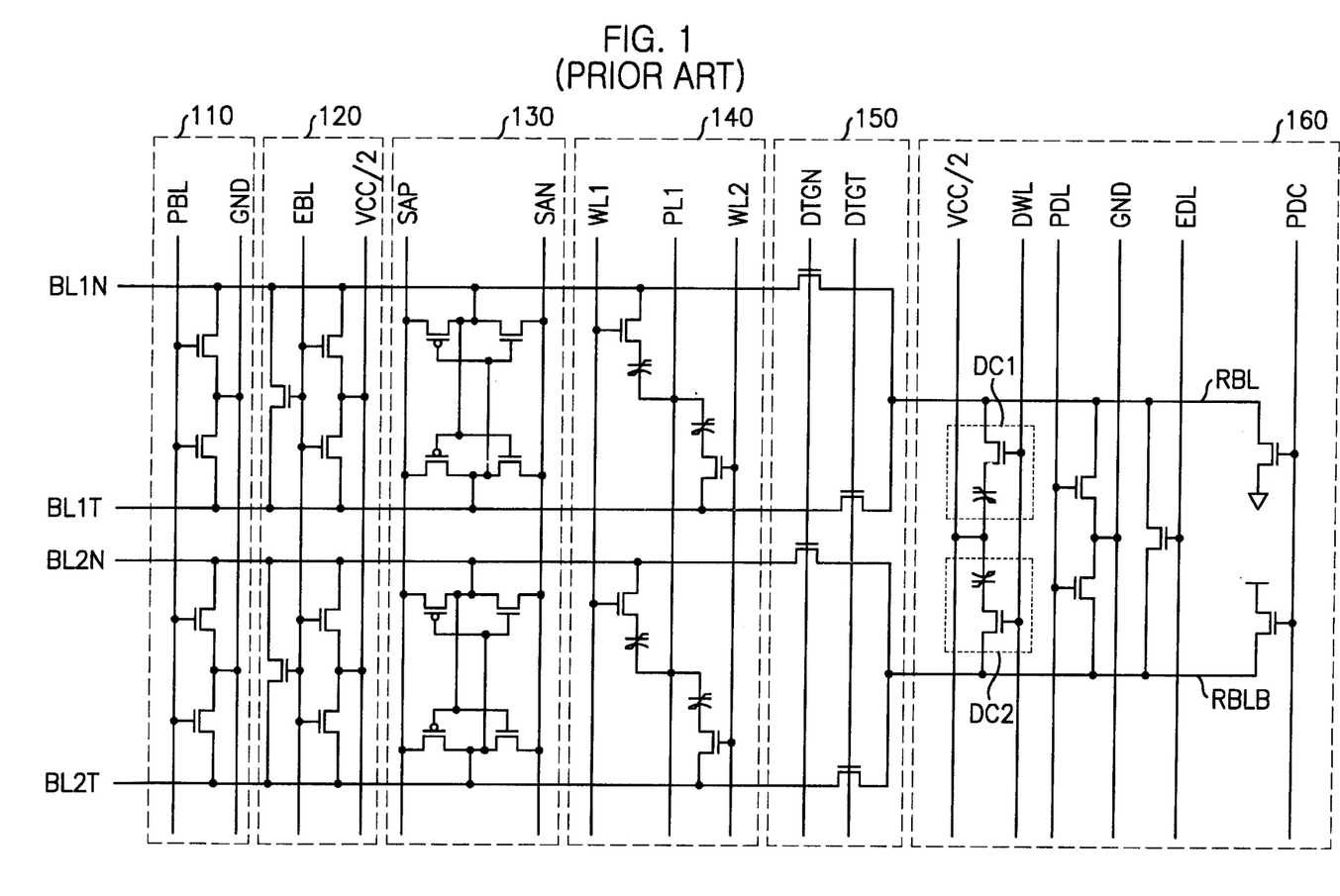
FIG. 1 is a circuit diagram showing a conventional ferroelectric memory device.

Referring to FIG. 1, there is shown a circuit diagram showing a conventional ferroelectric memory device. As shown, the conventional ferroelectric memory device includes a precharge circuit 110, an equalization circuit 120, a sense amplifier 130, a memory cell array 140, a reference voltage transfer circuit 150 and a reference voltage generation circuit 160. The conventional ferroelectric memory device includes a pair of complementary bit lines BL1N and BL1T and a pair of complementary bit lines BL2N and BL2T.

The precharge circuit 110 coupled to the complementary bit lines BL1N, BL1T, BL2N and BL2T precharges the complementary bit lines BL1N, BL1T, BL2N and BL2T to ground in response to a precharge signal PBL.

The equalization circuit 120 coupled to the complementary bit lines BL1N, BL1T, BL2N and BL2T equalizes the bit lines BL1N, BL1T, BL2N and BL2T to a half of a supply voltage Vcc, i.e., Vcc/2, in response to an equalization signal EBL.

The sense amplifier 130 is coupled to the complementary bit lines BL1N, BL1T, BL2N and BL2T. The sense amplifier 130 senses and amplifies a voltage difference between the complementary bit lines BL1N and BL1T or the complementary bit lines BL2N and BL2T in response to PMOS and NMOS enable signals SAP and SAN at a read operation.

The memory cell array 140 includes a plurality of memory cells, wherein one of the memory cells has an N-channel metal oxide semiconductor (NMOS) transistor and a ferroelectric capacitor. A drain terminal of the NMOS transistor contained in the one of the memory cells is coupled to the complementary bit line BL1N, BL1T, BL2N or BL2T. Further, a gate terminal of the NMOS transistor contained in the one of the memory cells is coupled to a word line WL1 or WL2. The ferroelectric capacitor is coupled between a plate line PL1 and a source terminal of the NMOS transistor contained in the one of the memory cells. The reference voltage generation circuit 160 coupled to the complementary bit lines BL1N, BL1T, BL2N and BL2T generates a reference voltage to send the reference voltage to the reference voltage transfer circuit 150. The reference voltage generation circuit 160 includes two dummy cells DC1 and DC2, wherein the dummy cells DC1 and DC2 include the NMOS transistor and the capacitor, respectively.

The drain terminal of the NMOS transistor contained in the dummy cell DC1 or DC2 is coupled to the complementary bit line RBL or RBLB. Further, the gate terminal of the NMOS transistor contained in the dummy cell DC1 or DC2 is coupled to a word line DWL. The ferroelectric capacitor contained in the dummy cell DC1 or DC2 is coupled between a line coupled to the half of the supply voltage Vcc, i.e., Vcc/2, and the source terminal of the NMOS transistor contained in the dummy cell DC1 or DC2. The complementary bit lines RBL and RBLB are precharged to ground in response to a precharge signal PDL. The complementary bit lines RBL and RBLB are equalized in response to an equalization signal EDL. The complementary bit lines RBL and RBLB are pulled down in the response to a pull-down control signal PDC.

The reference voltage transfer circuit 150 couples the complementary bit line BL1N or BL1T to the complementary bit line RBL in response to transfer control signals DTGN and DTGT, thereby transferring the reference voltage from the reference voltage generation circuit 160 through the complementary bit line BL1N or BL1T. Further, the reference voltage transfer circuit 150 couples the complementary bit line BL2N or BL2T to the complementary bit line RBLB in response to transfer control signals DTGN and DTGT, thereby transferring the reference voltage from the reference voltage generation circuit 160 through the complementary bit line BL2N or BL2T.

In the conventional ferroelectric memory device, the number of operation times of the dummy cell DC1 or DC2 contained in the reference voltage generation circuit 160 is greater than that of the one of memory cells contained in the memory cell array 140. Further, the ferroelectric capacitor contained in the dummy cell DC1 or DC2 is fatigued faster than that contained in the one of the memory cells. Where the ferroelectric capacitor contained in the dummy cell DC1 or DC2 is fatigued, the ferroelectric capacitor can not provide the reference voltage to a sense amplifier. Accordingly, the sense amplifier can not effectively sense and amplify a difference between the reference voltage from a complementary bit line and a voltage from another complementary bit line. Further, there is a problem that the conventional ferroelectric memory device increases its chip size by employing the complementary bit lines.

SUMMARY OF THE INVENTION

It is, therefore, an object of the present invention to provide a ferroelectric memory device having a single bit line that can effectively sense and amplify a difference between a reference voltage and a voltage from the single bit line coupled to at least one memory cell.

It is, therefore, another object of the present invention to provide a ferroelectric memory device that can reduce its chip size by employing a single bit line coupled to at least one memory cell.

In accordance with an aspect of the present invention, there is provided a semiconductor memory device, comprising: a single bit line; at least one memory cell coupled to said single bit line for storing a first charge corresponding to predetermined data; a reference voltage generation means for generating a reference voltage as a first voltage; a charge pump means for generating a second charge substantially corresponding to the reference voltage; a combination means for combining the first charge with the second charge at a read operation, thereby generating a second voltage; and a sense amplifier coupled to said single bit line for sensing and amplifying a difference between the first voltage and the second voltage, to thereby read out the predetermined data.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Figure 2:
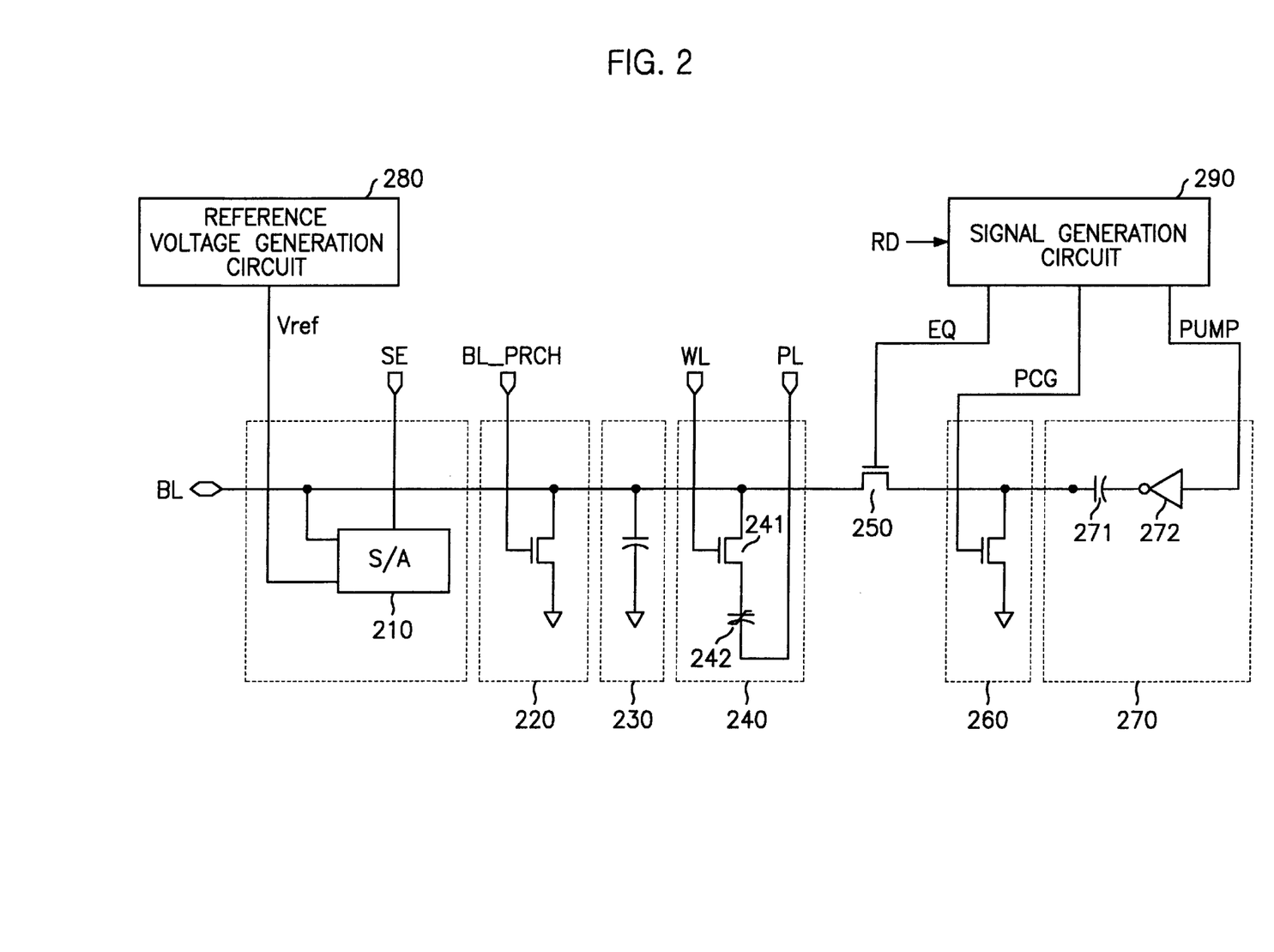
FIG. 2 is an exemplary schematic diagram describing a ferroelectric memory device in accordance with a first embodiment of the present invention.

Referring to FIG. 2, there is shown an exemplary schematic diagram describing a ferroelectric memory device in accordance with a first embodiment of the present invention. As shown, the ferroelectric memory device includes a single bit line BL, a sense amplifier (S/A) 210, precharge circuits 220 and 260, a memory cell 240, an NMOS transistor 250, a charge pump circuit 270, a reference voltage generation circuit 280 and a signal generation circuit 290.

The memory cell 240 coupled to the single bit line BL stores a first charge corresponding to predetermined data. The memory cell 240 includes an NMOS transistor 241 and a ferroelectric capacitor 242.

The ferroelectric capacitor 242 stores the first charge corresponding to the predetermined data. The ferroelectric capacitor 242 includes upper and lower conducting plates. The upper conducting plate of the ferroelectric capacitor 242 is coupled to a source terminal of the NMOS transistor 241. A plate line signal PL is supplied to the lower conducting plate of the ferroelectric capacitor 242.

The NMOS transistor 241 selectively couples the first charge to the single bit line BL. The NMOS transistor 241 is turned on in response to a word line signal WL. When the NMOS transistor 241 is turned on at a read operation, the NMOS transistor 241 switches the first charge from the ferroelectric capacitor 242 to the single bit line BL. The word line signal WL is supplied to a gate terminal of the NMOS transistor 241. A drain terminal of the NMOS transistor 241 is coupled to the single bit line BL.

The reference voltage generation circuit 280 coupled to the single bit line BL generates a reference voltage Vref as a first voltage to send the reference voltage Vref to the S/A 210. The reference voltage generation circuit 280 can be implemented as a CMOS circuit or a combination of a complementary MOS (CMOS) circuit and a capacitor.

The signal generation circuit 290 generates control signals EQ, PCG and PUMP in response to a read signal RD. The charge pump circuit 270 generates a second charge substantially corresponding to the reference voltage Vref. The charge pump circuit 270 includes a capacitor 271 and an inverter 272. The inverter 272 inverts the control signal PUMP from the signal generation circuit 290. The capacitor 271 stores the second charge corresponding to the inverted control signal.

The NMOS transistor 250 is turned on in response to the control signal EQ from the signal generation circuit 290. When the NMOS transistor 250 is turned on, the NMOS transistor 250 combines the first charge with the second charge so that a second voltage is generated.

The S/A 210 coupled to the single bit line BL senses and amplifies a difference between the first voltage and the second voltage in response to a sense enable signal SE. If the predetermined data is logic "1" data, the second voltage is greater than the first voltage. Further, if the predetermined data is logic "0" data, the second voltage is less than the first voltage.

The precharge circuit 220 precharges the single bit line BL to ground in response to a precharge signal BL_PRCH, wherein the precharge circuit 220 is implemented as an NMOS transistor. The single bit line BL has a parasitic capacitance 230. The precharge circuit 260 precharges the single bit line BL to ground in response to the control signal PCG, wherein the precharge circuit 260 is implemented as the NMOS transistor.

Figure 3:
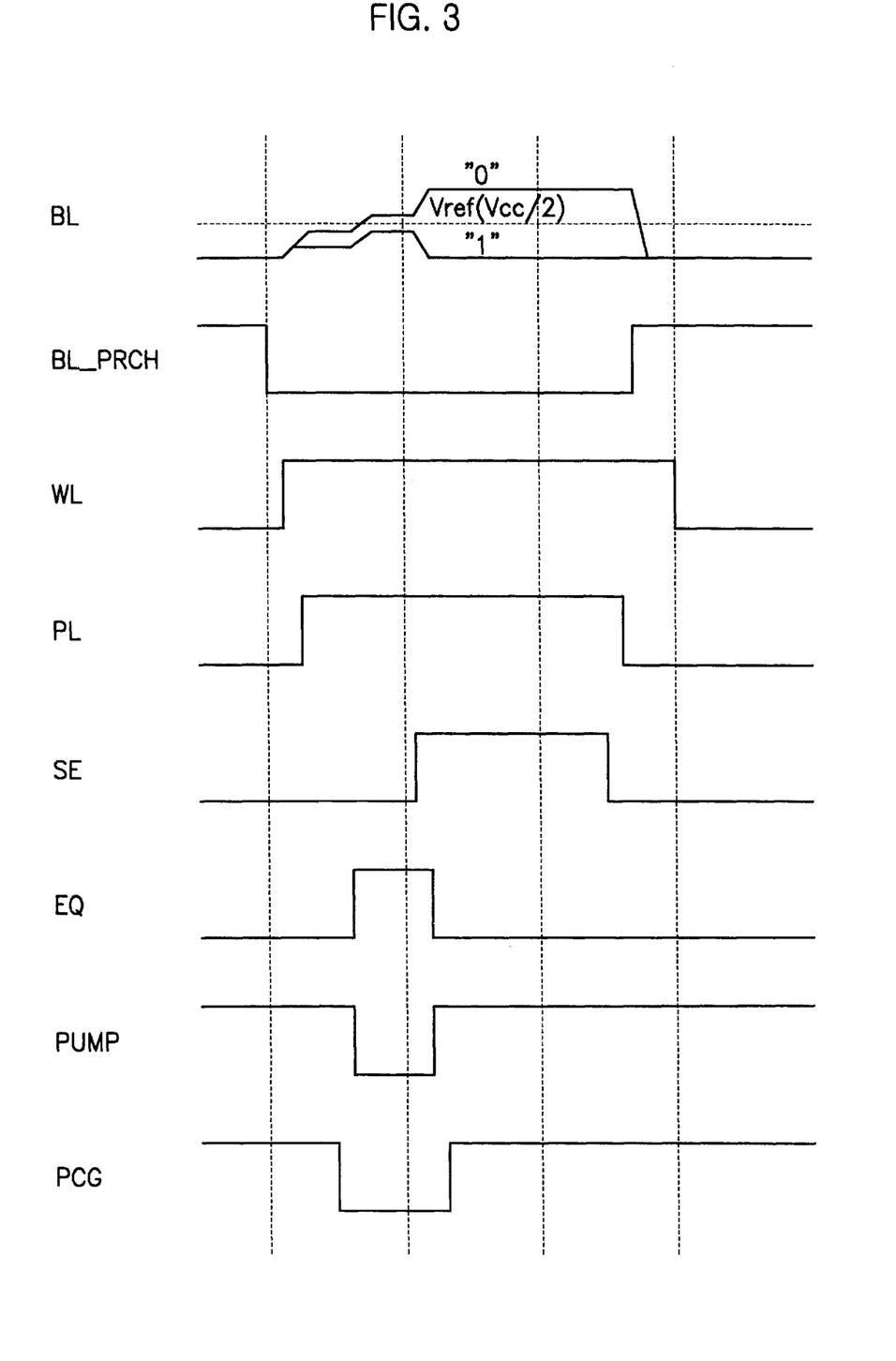
FIG. 3 is a timing chart illustrating an operation of a ferroelectric memory device shown in FIG. 2.

Referring to FIG. 3, there is shown a timing chart illustrating an operation of a ferroelectric memory device shown in FIG. 2.

Referring to FIGS. 2 and 3, when the read signal RD is enable, the precharge signal BL_PRCH is low. After the precharge signal BL_PRCH is low, the word line signal WL and the plate line signal PL are high, respectively. When the word line signal WL and the plate line signal PL are high, respectively, the memory cell 240 sends the first charge corresponding to the predetermined data to the single bit line BL.

While the word line signal WL and the plate line signal PL are high, the control signal PCG is low. Further, the control signals EQ and PUMP are high and low, respectively. At this time, the charge pump circuit 270 generates the second charge substantially corresponding to the reference voltage Vref. Then, the NMOS transistor 250 is turned on to combine the first charge and the second charge so that the second voltage is generated.

Assuming that the reference voltage Vref is a half of a supply voltage Vcc, the second voltage fr6m the single bit line BL is greater than the half of the supply voltage Vcc, i.e. ½Vcc, if the predetermined data is the logic "1" data. Further, if the predetermined data is the logic "0" data, the second voltage from the single bit line BL is less than the half of the supply voltage Vcc, i.e. ½Vcc. When the sense enable signal SE is high, the S/A 210 senses and amplifies a difference between the first voltage and the second voltage.

Figure 4:
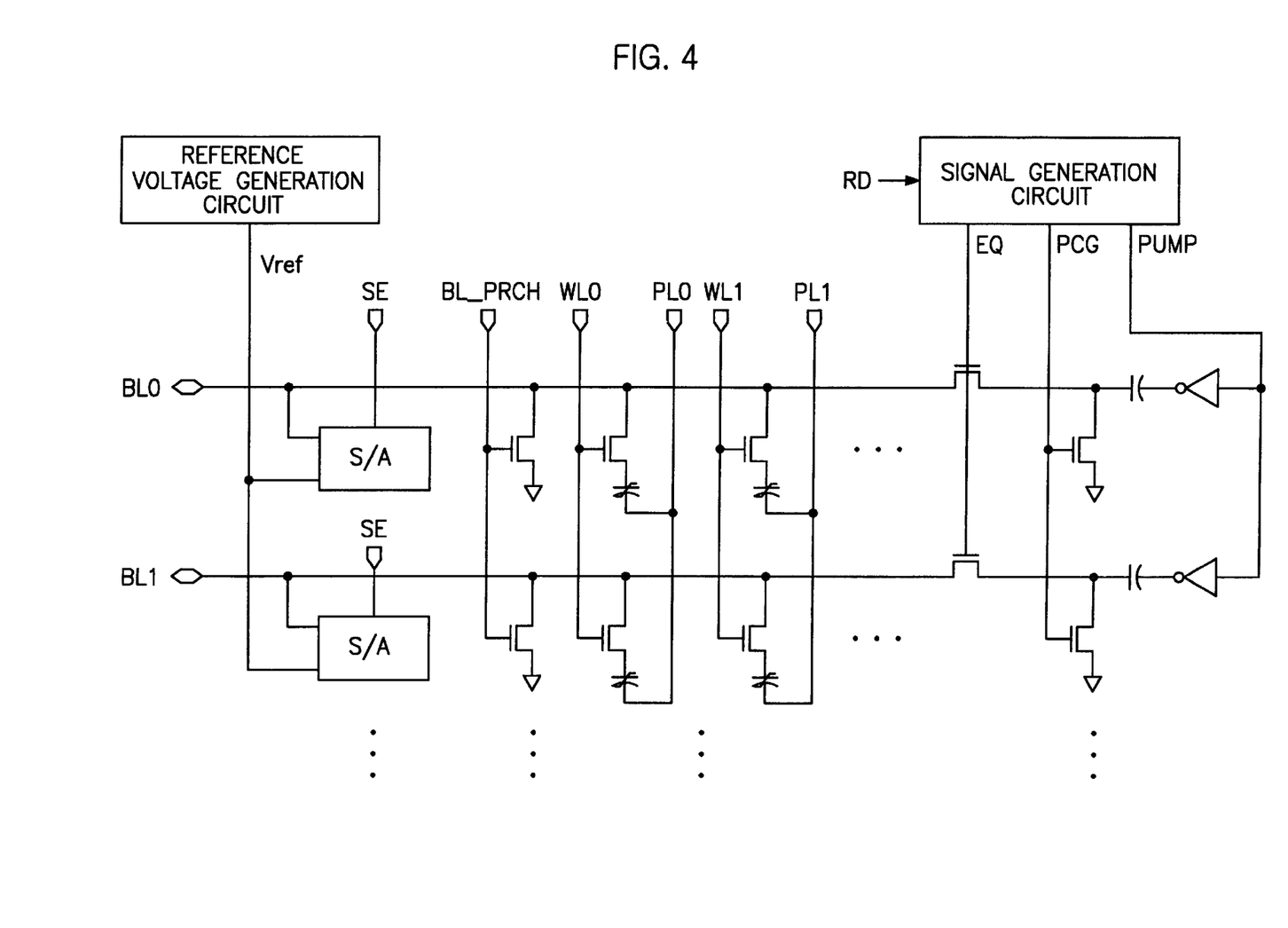
FIG. 4 is an exemplary schematic diagram describing a ferroelectric memory device in accordance with a second embodiment of the present invention.

Referring to FIG. 4, there is shown an exemplary schematic diagram describing a ferroelectric memory device in accordance with a second embodiment of the present invention. As shown, a structure of the ferroelectric memory device of the second embodiment shown in FIG. 4 is the same as that of the ferroelectric memory device of the first embodiment in FIG. 2 except that the single bit line BL0 or BL1 contained in the ferroelectric memory device of the second embodiment is coupled to a plurality of memory cells.

Figure 5:
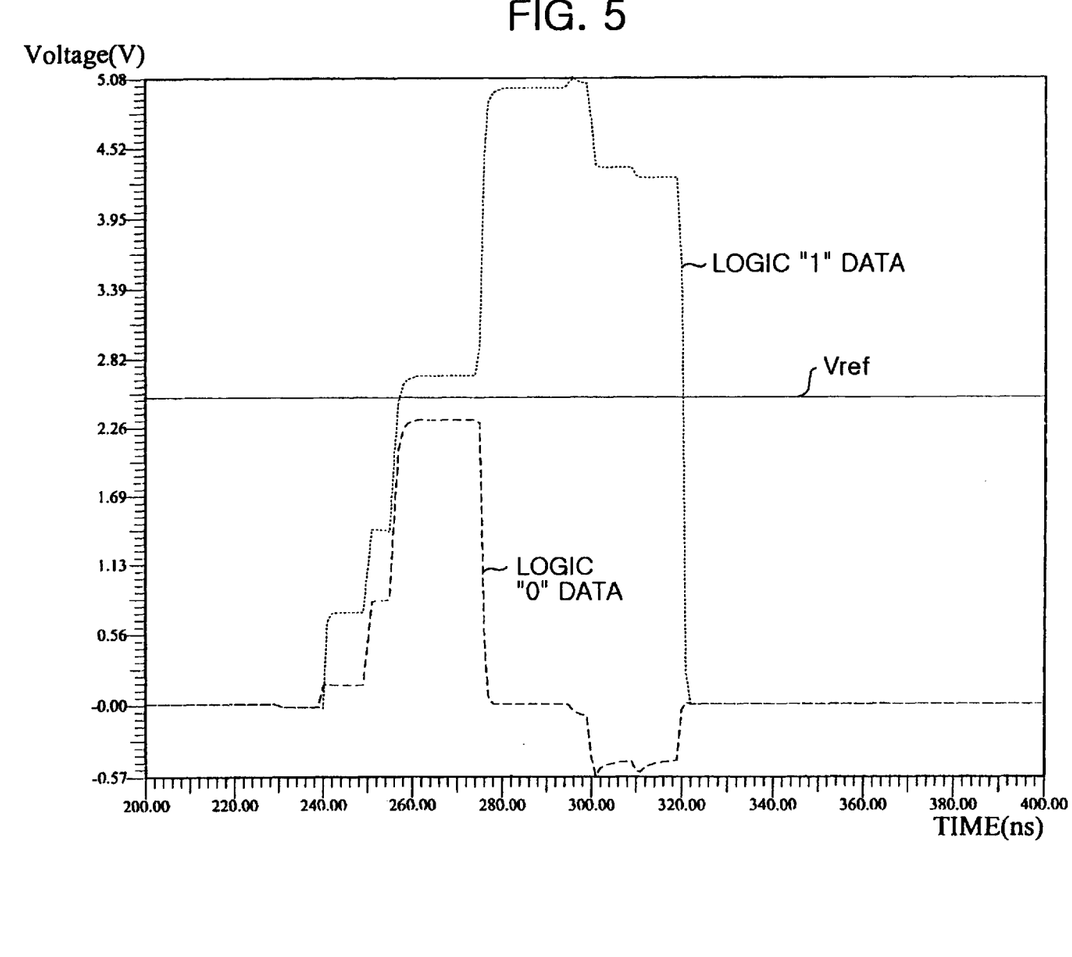
FIG. 5 is a waveform diagram illustrating voltages of logic "1" and "0" data read out from a single bit line contained in a ferroelectric memory device shown in FIG. 4.

Referring to FIG. 5, there is shown a waveform diagram illustrating voltages of logic "1" and "0" data read out from a single bit line contained in a ferroelectric memory device shown in FIG. 4.

Figure 6:
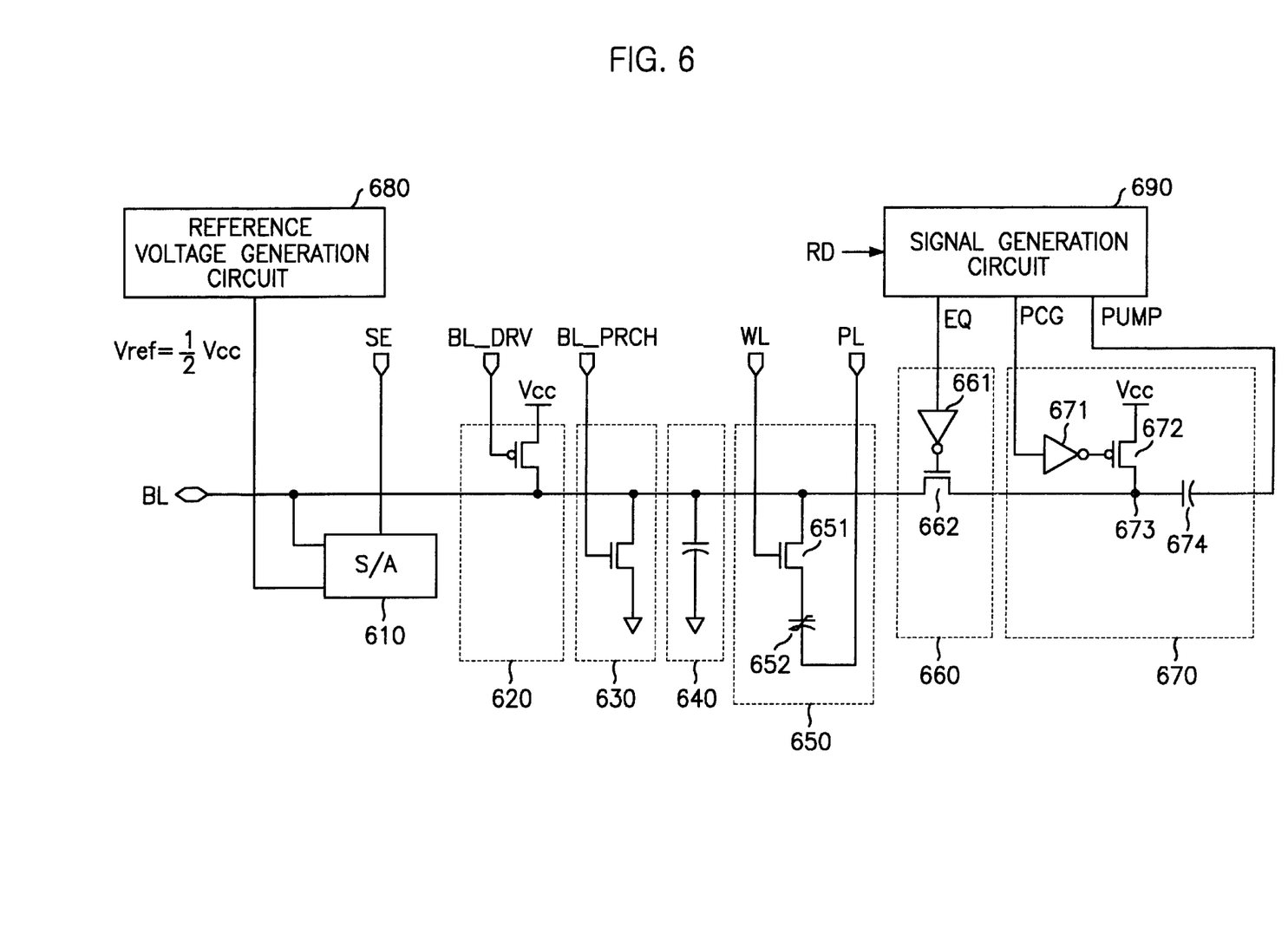
FIG. 6 is an exemplary schematic diagram showing a ferroelectric memory device in accordance with a third embodiment of the present invention.

Referring to FIG. 6, there is shown an exemplary schematic diagram showing a ferroelectric memory device in accordance with a third embodiment of the present invention. As shown, the ferroelectric memory device includes a single bit line BL, a sense amplifier (S/A) 610, a PMOS transistor 620, a precharge circuit 630, a memory cell 650, a coupler 660, a charge pump circuit 670, a reference voltage generation circuit 680 and a signal generation circuit 690.

The memory cell 650 coupled to the single bit line BL stores a first charge corresponding to predetermined data. The memory cell 650 includes an NMOS transistor 651 and a ferroelectric capacitor 652.

The ferroelectric capacitor 652 stores the first charge corresponding to the predetermined data. The ferroelectric capacitor 652 includes upper and lower conducting plates. The upper conducting plate of the ferroelectric capacitor 652 is coupled to a source terminal of the NMOS transistor 651. A plate line signal PL is supplied to the lower conducting plate of the ferroelectric capacitor 652.

The NMOS transistor 651 selectively couples the first charge to the single bit line BL. The NMOS transistor 651 is turned on in response to a word line signal WL. When the NMOS transistor 651 is turned on at a read operation, the NMOS transistor 651 switches the first charge from the ferroelectric capacitor 652 to the single bit line BL. The word line signal WL is supplied to a gate terminal of the NMOS transistor 651. A drain terminal of the NMOS transistor 651 is coupled to the single bit line BL.

The reference voltage generation circuit 680 coupled to the single bit line BL generates a reference voltage Vref as a half of a supply voltage Vcc, i.e., Vcc/2, to send the reference voltage Vref to the S/A 610. Hereinafter, the reference voltage Vref is referred to as a first voltage. The reference voltage generation circuit 680 can be implemented as a CMOS circuit or a combination of a CMOS circuit and a capacitor.

The signal generation circuit 690 generates control signals EQ, PCG and PUMP in response to a read signal RD. The charge pump circuit 670 generates a second charge substantially corresponding to the half of the supply voltage Vcc, i.e., Vcc/2. The charge pump circuit 670 includes an inverter 671, a P-channel metal oxide semiconductor (PMOS) transistor 672, a coupling node 673 and a capacitor 674. The capacitor 674 coupled to the signal generation circuit 690 stores a negative charge corresponding to the control signal PUMP from the signal generation circuit 690. The PMOS transistor 672 selectively couples the supply voltage Vcc to the single bit line BL in response to the control signal EQ. The coupling node 673 combines the supply voltage Vcc with the negative charge to generate the second charge substantially corresponding to the half of the supply voltage Vcc, i.e. Vcc/2.

The coupler 660 responsive to the control signal EQ combines the first charge with the second charge, thereby generating a second voltage. The coupler 660 includes an inverter 661 and an NMOS transistor 662.

The S/A 610 coupled to the single bit line BL senses and amplifies a difference between the first voltage and the second voltage in response to an enable signal SE. If the predetermined data is logic "1" data, the second voltage is greater than the first voltage. Further, if the predetermined data is logic "0" data, the second voltage is less than the first voltage.

The precharge circuit 630 precharges the bit line BL to ground in response to a precharge signal BL_PRCH, wherein the precharge circuit 630 is implemented as an NMOS transistor. The single bit line BL has a parasitic capacitance 640. The NMOS transistor 620 provides the supply voltage Vcc to the single bit line BL in response to a drive signal BL DRV.

Figure 7:
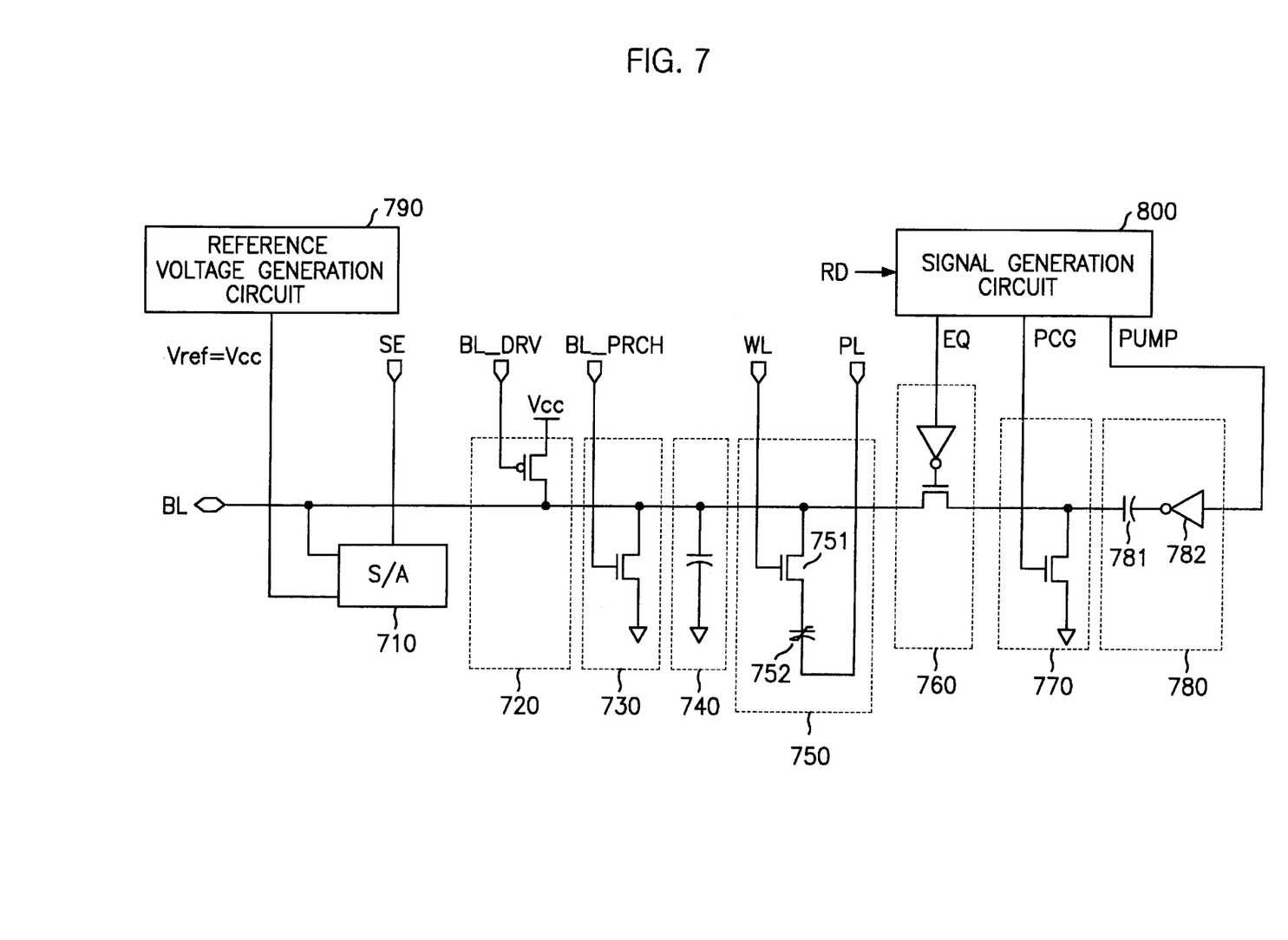
FIG. 7 is an exemplary schematic diagram showing a ferroelectric memory device in accordance with a fourth embodiment of the present invention.

Referring to FIG. 7, there is shown an exemplary schematic diagram showing a ferroelectric memory device in accordance with a fourth embodiment of the present invention. As shown, the ferroelectric memory device includes a single bit line BL, a sense amplifier (S/A) 710, a PMOS transistor 720, precharge circuits 730 and 770, a memory cell 750, a coupler 760, a charge pump circuit 780, a reference voltage generation circuit 790 and a signal generation circuit 800.

The memory cell 750 coupled to the single bit line BL stores a first charge corresponding to predetermined data. The memory cell 750 includes an NMOS transistor 751 and a ferroelectric capacitor 752.

The ferroelectric capacitor 752 stores the first charge corresponding to the predetermined data. The ferroelectric capacitor 752 includes upper and lower conducting plates. The upper conducting plate of the ferroelectric capacitor 752 is coupled to a source terminal of the NMOS transistor 751. A plate line signal PL is supplied to the lower conducting plate of the ferroelectric capacitor 752.

The NMOS transistor 751 selectively couples the first charge to the single bit line BL. The NMOS transistor 751 is turned on in response to a word line signal WL. When the NMOS transistor 751 is turned on at a read operation, the NMOS transistor 751 switches the first charge from the ferroelectric capacitor 752 to the single bit line BL. The word line signal WL is supplied to a gate terminal of the NMOS transistor 751. A drain terminal of the NMOS transistor 751 is coupled to the single bit line BL.

The reference voltage generation circuit 790 coupled to the single bit line BL generates a reference voltage Vref as a supply voltage Vcc to send the reference voltage Vref to the S/A 710. Hereinafter, the reference voltage Vref is referred to as a first voltage. The reference voltage generation circuit 790 can be implemented as a CMOS circuit or a combination of a CMOS circuit and a capacitor.

The signal generation circuit 800 generates control signals EQ, PCG and PUMP in response to a read signal RD. The charge pump circuit 780 generates a second charge substantially corresponding to the supply voltage Vcc. The charge pump circuit 780 includes a capacitor 781 and an inverter 782. The inverter 782 inverts the control signal PUMP from the signal generation circuit 800. The capacitor 781 stores the second charge corresponding to the inverted control signal.

The coupler 760 responsive to the control signal EQ combines the first charge with the second charge, thereby generating a second voltage. The coupler 760 includes an inverter and an NMOS transistor.

The S/A 710 coupled to the single bit line BL senses and amplifies a difference between the first voltage and the second voltage in response to a sense enable signal SE. If the predetermined data is logic "1" data, the second voltage is greater than the first voltage. Further, if the predetermined data is logic "0" data, the second voltage is less than the first voltage.

The precharge circuit 730 precharges the single bit line BL to ground in response to a precharge signal BL_PRCH, wherein the precharge circuit 730 is implemented as an NMOS transistor. The single bit line BL has a parasitic capacitance 740. The precharge circuit 770 precharges the single bit line BL to ground in response to the control signal PCG, wherein the precharge circuit 770 is implemented as the NMOS transistor.

Figure 8:
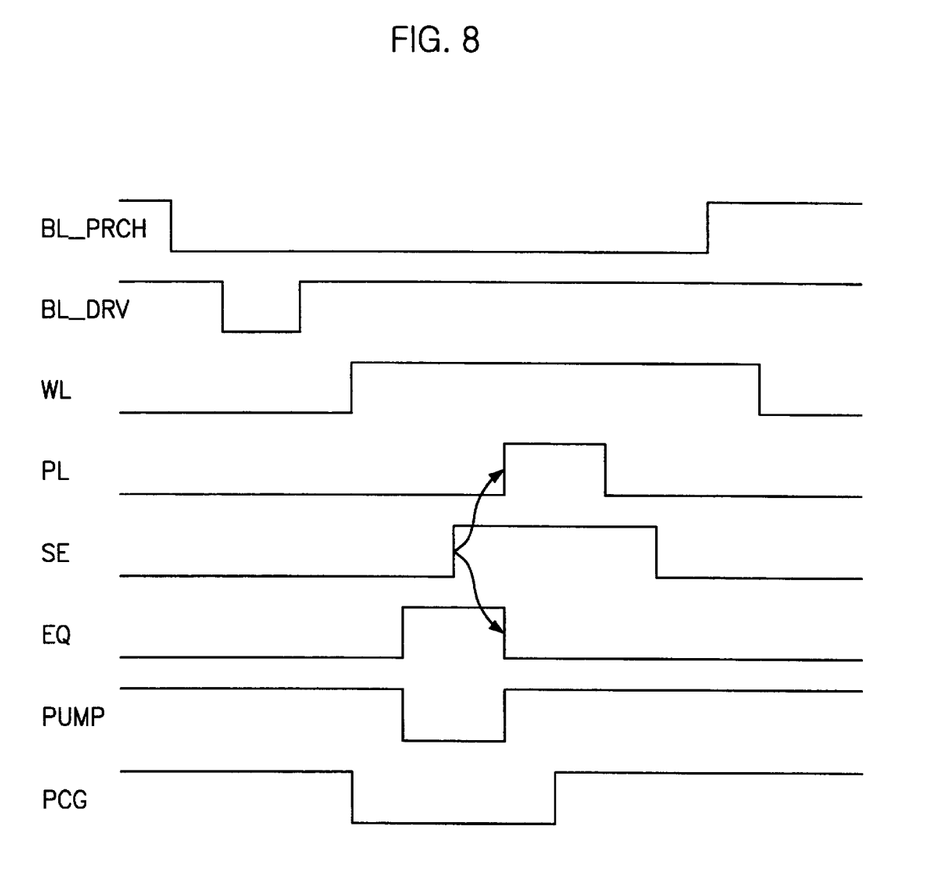
FIG. 8 is a timing chart illustrating an operation of a ferroelectric memory device shown in FIG. 6.

Referring to FIG. 8, there is shown a timing chart illustrating an operation of a ferroelectric memory device shown in FIG. 6.

Referring to FIGS. 6 and 8, when the read signal RD is enable, the precharge signal BL_PRCH is low. After the precharge signal BL_PRCH is low, the drive signal BL DRV is low for a predetermined time period. After the predetermined time period, the word line signal WL and the control signal PCG are high and low, respectively. Then, the control signals EQ and PUMP are high and low, respectively. After the control signals EQ and PUMP are high and low, respectively, the sense enable signal SE is high. When the control signal EQ is transited from a high signal to a low signal, the plate line signal PL is high.

Figure 9:
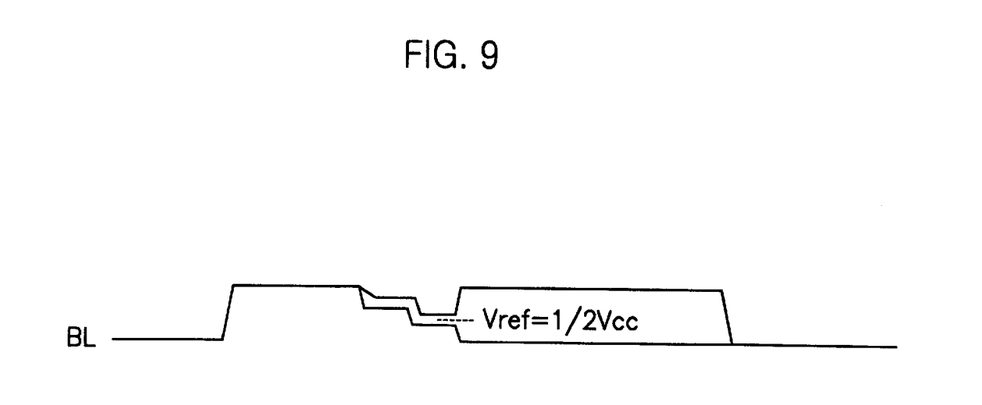
FIG. 9 is a waveform diagram depicting a voltage from a single bit line contained in a ferroelectric memory device shown in FIG. 6.
Figure 10:
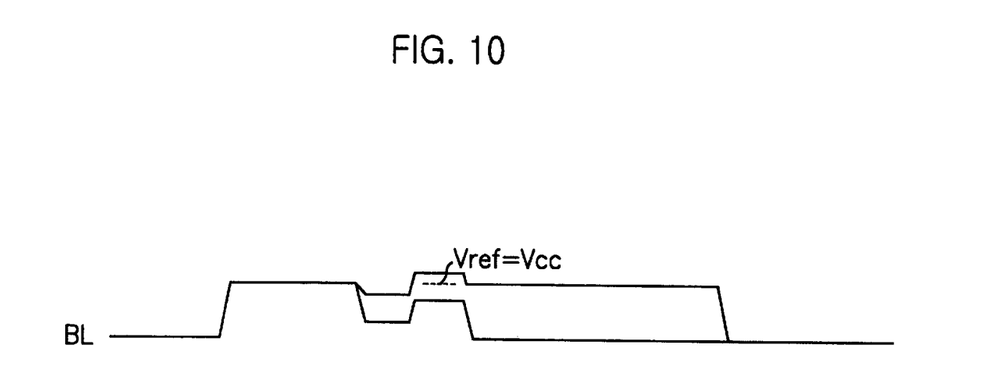
FIG. 10 is a waveform diagram showing a voltage from a single bit line contained in a ferroelectric memory device shown in FIG. 7.

Referring to FIG. 9, there is shown a waveform diagram depicting a voltage from a single bit line BL contained in a ferroelectric memory device shown in FIG. 6 when a reference voltage Vref is a half of a supply voltage Vcc, i.e., Vcc/2. Referring to FIG. 10, there is shown a waveform diagram showing a voltage from a single bit line BL contained in a ferroelectric memory device shown in FIG. 7 when a reference voltage Vref is a supply voltage Vcc.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device, comprising:
   a single bit line;
   at least one memory cell coupled to said single bit line for storing a first charge corresponding to predetermined data;
   a reference voltage generation means for generating a reference voltage as a first voltage;
   a charge pump means for generating a second charge substantially corresponding to the reference voltage;
   a combination means for combining the first charge with the second charge at a read operation, thereby generating a second voltage; and
   a sense amplifier coupled to said single bit line for sensing and amplifying a difference between the first voltage and the second voltage, to thereby read out the predetermined data.

2. The semiconductor memory device as recited in claim 1, wherein said at least one memory cell includes:
   a ferroelectric capacitor for storing the first charge corresponding to the predetermined data; and
   a transistor for selectively coupling the first charge to said single bit line at the read operation.

3. The semiconductor memory device as recited in claim 1, wherein said combination means includes:
   a signal generation means responsive to a read signal for generating a control signal; and
   a coupling mean responsive to the control signal for combining the first charge with the second charge, thereby generating the second voltage.

4. The semiconductor memory device as recited in claim 3, wherein the control signal includes first, second and third control signals.

5. The semiconductor memory device as recited in claim 4, wherein said coupling means combines the first charge with the second charge in response to the first control signal.

6. The semiconductor memory device as recited in claim 5, wherein the first voltage includes a supply voltage.

7. The semiconductor memory device as recited in claim 6, wherein the second charge substantially corresponds to the supply voltage.

8. The semiconductor memory device as recited in claim 7, wherein said coupling means further includes;
   a precharge means for precharging said single bit line to ground in response to the second control signal.

9. The semiconductor memory device as recited in claim 8, wherein said charge pump means includes;
   a capacitor coupled to said signal generation means for storing the second charge corresponding to the third control signal.

10. The semiconductor memory device as recited in claim 8, wherein said charge pump means includes;
    an inverter coupled to said signal generation means for inverting the third control signal; and
    a capacitor for storing the second charge corresponding to the inverted third control signal.

11. The semiconductor memory device as recited in claim 5, wherein the first voltage includes a half of a supply voltage.

12. The semiconductor memory device as recited in claim 11, wherein the second charge substantially corresponds to the half of the supply voltage.

13. The semiconductor memory device as recited in claim 12, wherein said charge pump means includes;
    a capacitor coupled to said signal generation means for storing a negative charge corresponding to the third control signal;
    a power supply means for providing the supply voltage to said single bit line in response to the second control signal; and
    a coupling means for combining the supply voltage with the negative charge to generate the second charge substantially corresponding to the half of the supply voltage.

14. The semiconductor memory device as recited in claim 13, wherein said power supply means includes:
    a power supply for providing the supply voltage; and
    a PMOS transistor for selectively coupling the supply voltage to said single bit line in response to the second control signal.

15. The semiconductor memory device as recited in claim 1, wherein said reference voltage generation means includes a CMOS circuit.

16. The semiconductor memory device as recited in claim 1, wherein said reference voltage generation means includes a combination of a CMOS circuit and a capacitor.

17. The semiconductor memory device as recited in claim 1, wherein the second voltage is greater than the first voltage if the predetermined data is logic "1" data.

18. The semiconductor memory device as recited in claim 1, wherein the second voltage is less than the first voltage if the predetermined data is logic "0" data.

19. The semiconductor memory device as recited in claim 1, further comprising;
    a precharge means coupled to said single bit line for precharging said single bit line to ground.

* * * * *